US012050777B2

(12) United States Patent
Chang et al.

(10) Patent No.: US 12,050,777 B2
(45) Date of Patent: Jul. 30, 2024

(54) ADAPTIVE SCANNING OF MEMORY DEVICES WITH SUPERVISED LEARNING

(71) Applicant: Micron Technology, Inc., Boise, ID (US)

(72) Inventors: Li-Te Chang, San Jose, CA (US); Murong Lang, San Jose, CA (US); Charles See Yeung Kwong, Redwood City, CA (US); Vamsi Pavan Rayaprolu, Santa Clara, CA (US); Seungjune Jeon, Santa Clara, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 168 days.

(21) Appl. No.: 17/880,213

(22) Filed: Aug. 3, 2022

(65) Prior Publication Data

US 2024/0045595 A1 Feb. 8, 2024

(51) Int. Cl.
 *G06F 3/06* (2006.01)
 *G06N 20/00* (2019.01)
(52) U.S. Cl.
 CPC .......... *G06F 3/0616* (2013.01); *G06F 3/0653* (2013.01); *G06F 3/0679* (2013.01); *G06N 20/00* (2019.01)
(58) Field of Classification Search
 CPC .... G06F 3/0614; G06F 3/0616; G06F 3/0619; G06F 3/0653; G06F 3/0679; G06N 20/00
 USPC ..... 365/185.18, 185.21, 185.22; 706/12, 13; 711/154
 See application file for complete search history.

(56) References Cited

U.S. PATENT DOCUMENTS

| | | | |
|---|---|---|---|
| 11,749,354 B2* | 9/2023 | Zhang | G06N 3/045 365/185.18 |
| 2013/0326285 A1* | 12/2013 | Eguchi | G11C 16/3422 714/48 |
| 2023/0055823 A1* | 2/2023 | Steiner | G11C 11/5642 |
| 2023/0176768 A1* | 6/2023 | Asadi | G11C 16/0483 |

* cited by examiner

*Primary Examiner* — Ilwoo Park
(74) *Attorney, Agent, or Firm* — Lowenstein Sandler LLP

(57) ABSTRACT

A processing device in a memory sub-system determines whether a media endurance metric associated with a memory block of a memory device satisfies one or more conditions. In response to the one or more conditions being satisfied, one or more read margin levels corresponding to a page type associated with the memory device are determined. A machine learning model is applied to the one or more read margin levels to generate a margin prediction value based on the page type and a wordline group associated with the memory device. Based on the margin prediction value, the memory device is assigned to a selected bin of a set of bins. A media scan operation is executed on the memory device in accordance with a scan frequency associated with the selected bin.

20 Claims, 9 Drawing Sheets

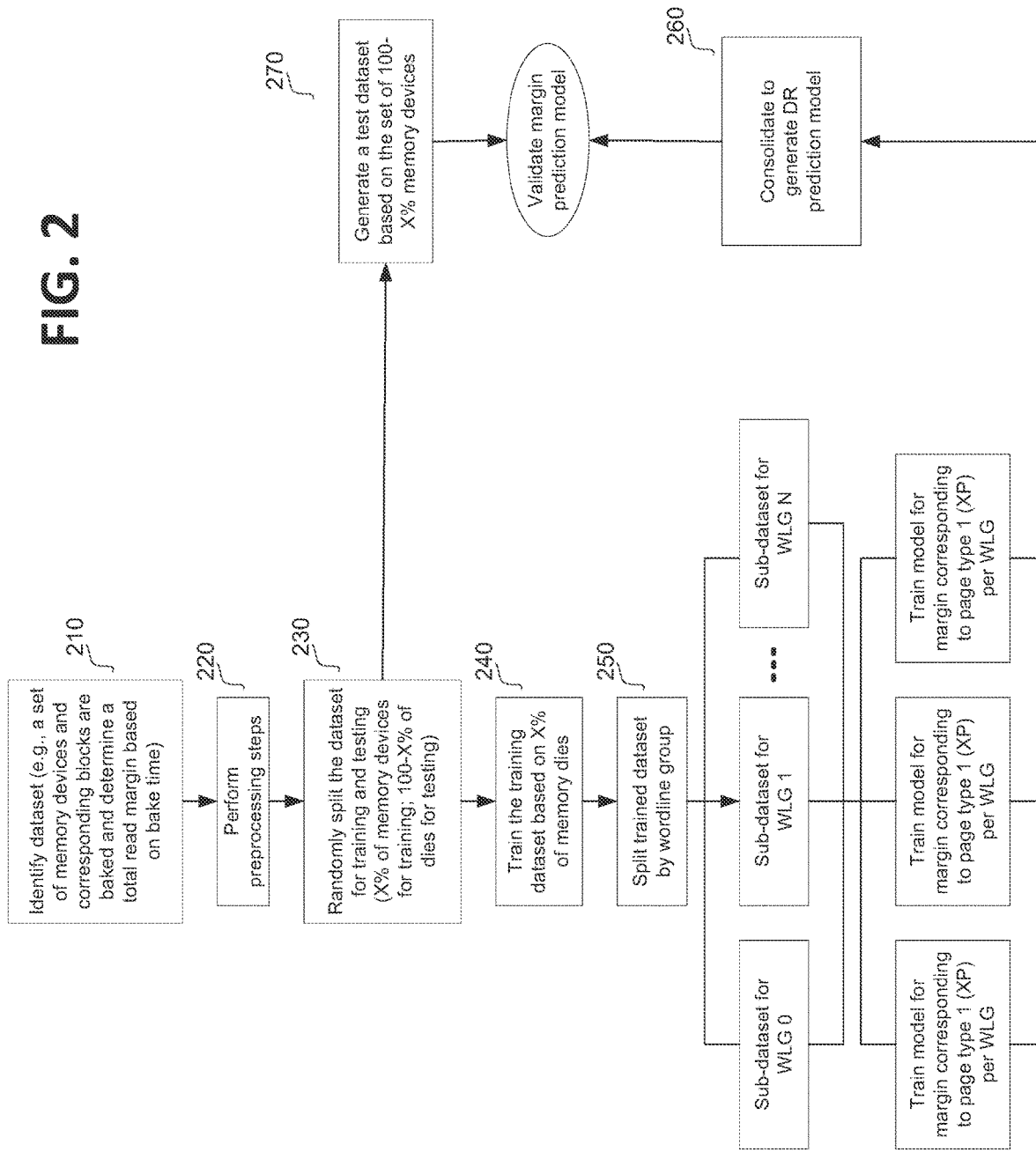

| BIN NUMBER | XP Binning Criteria | XP Folding Threshold | UP Binning Criteria | UP Folding Threshold | LP Binning Criteria | LP Folding Threshold |
|---|---|---|---|---|---|---|
| BIN 1 | Binning Threshold 1 XP (BT1_XP) < margin prediction < BT2_XP | Folding Threshold 1 (XP) | BT1_UP < margin prediction < BT2_UP | Folding Threshold 1 (UP) | BT1_LP < margin prediction < BT2_LP | Folding Threshold 1 (LP) |
| BIN 2 | BT2_XP < margin prediction < BT3_XP | Folding Threshold 2 (XP) | BT2_UP < margin prediction < BT3_UP | Folding Threshold 2 (UP) | BT2_LP < margin prediction < BT3_LP | Folding Threshold 2 (LP) |
| BIN 3 | margin prediction > BT3_XP | Folding Threshold 3 (XP) | margin prediction > BT3_UP | Folding Threshold 3 (UP) | margin prediction > BT3_LP | Folding Threshold 3 (LP) |

ADAPTIVE SCANNING OF MEMORY DEVICES WITH SUPERVISED LEARNING

TECHNICAL FIELD

Embodiments of the disclosure relate generally to memory sub-systems, and more specifically, relate to adaptive scanning of memory devices with supervised learning.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 2 is a flow diagram of a method of establishing a supervised learning model to generate page type and wordline group-based margin predictions for a set of memory devices of a memory sub-system, in accordance with one or more embodiments of the present disclosure.

FIG. 5 illustrates an example data structure including binning criteria associated with multiple page types for use in comparing read margin predictions to execute bin assignments of memory devices, according to one or more embodiments of the present disclosure.

DETAILED DESCRIPTION

Figure 1A:
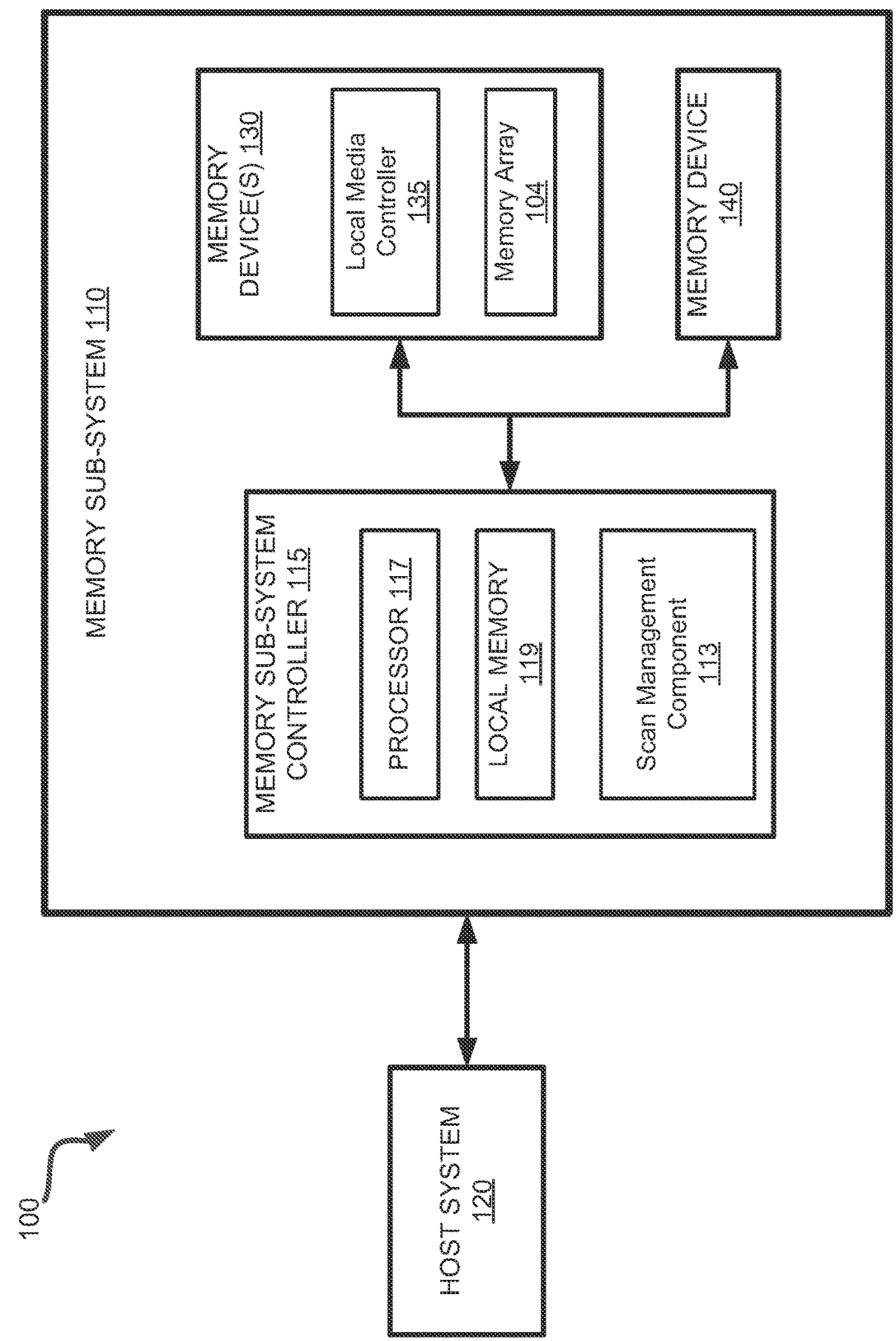
FIG. 1A illustrates an example computing system that includes a memory sub-system, in accordance with one or more embodiments of the present disclosure.

Aspects of the present disclosure are directed to testing to adaptive scanning of memory devices in a memory sub-system with supervised learning. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high-density non-volatile memory devices where retention of data is desired when no power is supplied to the memory device. One example of non-volatile memory devices is a not-and (NAND) memory device. Other examples of non-volatile memory devices are described below in conjunction with FIG. 1A. A non-volatile memory device is a package of one or more memory dies. Each die can consist of one or more planes. For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Each bit of the memory cell is stored at a different portion (also referred to as "logical page" hereafter) of the memory cell. Various read level thresholds can be used for the various logical page types (also referred to as "page types" herein). For example, a TLC memory device can include lower pages (LPs), upper pages (UPs), and extra pages (XPs). For example, a memory cell of the TLC memory can have a total of three logical pages, including a lower logical page (LP), an upper logical page (UP), and an extra logical page (XP), where each logical page stores a respective set of bits of data, such that in an example bit sequence $B_1B_2B_3$, $B_1$ (the most significant bit of the bit sequence) will be stored by the extra page (XP), $B_2$ (the intermediate bit of the bit sequence) will be stored the upper page (UP), and $B_3$ (the least significant bit of the bit sequence) will be stored by the lower page (LP). In a memory cell for TLC memory, each combination of three bits can be encoded by a respective voltage level (also referred to as a "level"). Because a memory cell for a TLC memory includes 3 bits of data, there are a total of 8 possible combinations (e.g., state levels L0 to L7) of the three bits of data.

A memory device (e.g., a memory die) can include memory cells arranged in a two-dimensional or a three-dimensional grid. The memory cells are formed onto a silicon wafer in an array of columns and rows. The memory cells are joined by wordlines, which are conducting lines electrically connected to the control gates of the memory cells, and bitlines, which are conducting lines electrically connected to the drain electrodes of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

A memory cell can be programmed (written to) by applying a certain voltage to the memory cell, which results in an electric charge being held by the memory cell, thus allowing modulation of the voltage distributions in the memory device. Moreover, precisely controlling the amount of the electric charge stored by the memory cell allows for multiple threshold voltage levels corresponding to different logical levels, thus effectively allowing a single memory cell to store multiple bits of information: a memory cell operated with 2n different threshold voltage levels is capable of storing n bits of information. Thus, the read operation can be performed by comparing the measured voltage exhibited by the memory cell to one or more reference voltage levels in order to distinguish between two logical levels for single-level cells and between multiple logical levels for multi-level cells.

For example, a triple-level cell (TLC) memory device can be programmed to multiple different programming states (e.g., distribution levels L1, L2, L3 . . . L7) and an erase state (distribution level L0), where the state of the memory can be determined by comparing a read voltage of the memory cell against one or more read level thresholds corresponding to the respective programming states (e.g., read level 1 for program level L1, read level 2 for program level L2, etc.).

Due to various physical phenomena and operational processes, such as slow charge loss and read disturb, charge levels of memory cells may degrade in time, thus causing higher error rates in memory read operations. Read disturb is a phenomenon where reading data from a memory cell can cause the threshold voltage of unread memory cells in the same block to shift to a different value. Slow charge loss is a phenomenon where the threshold voltage of a memory cell changes in time as the electric charge of the memory cell is degrading.

The resulting memory degradation can be measured by various data state metrics. "Data state metric" herein shall refer to a quantity that is measured or inferred from the state of data stored on a memory device. Specifically, the data state metrics may reflect the state of the slow charge loss, the degree of latent read disturb, the temporal voltage shift, and/or other measurable functions of the data state. A composite data state metric is a function (e.g., a weighted sum) of a set of component state metrics. In an illustrative example, the data state metric can be represented by an error metric (e.g., the raw bit error rate (RBER)), which is the number of bit errors experienced by a given data block per unit of time). As another example, the data state metric can include a bit error count (BEC) per page or failed bit count (FBC) per page. As yet another example, the data state metric can include a valley center shift or a valley width threshold measurement. The term "valley" can relate to the shape of a graph generated by the multiple non-overlapping distributions. The distributions (valleys) are interspersed with voltage intervals ("valley margins") where none (or very few) of the memory cells of the device have their threshold voltages. Such valley margins can, therefore, be used to separate various charge states.

The speed of memory degradation is highly dependent on one or more media endurance metrics, such as a number of program erase cycles (PEC), associated with the memory device. The number of PEC refers to the number of times a group of memory cells is erased and subsequently programmed with new data. Toward the memory device's end of life, as the memory device's PEC increases, memory degradation can occur more aggressively. Accordingly, a memory unit (e.g., a memory block) can be characterized based on age, which can be defined in view of a media endurance metric associated with the memory block (e.g., a number of program/erase (P/E) cycles that have been performed with respect to the memory unit). For example, a cycled block can refer to a block that has undergone a number of P/E cycles that exceeds a first threshold number of P/E cycles (e.g., an older block), and a fresh block can refer to a block that has undergone a number of P/E cycles less than a second threshold number of P/E cycles (e.g., a newer block).

In order to mitigate the memory degradation, data integrity check operations (also referred to herein as "scan operations") can be periodically performed on the memory device. The data integrity check can involve evaluating one or more data state metrics on one or more blocks of the memory device. Should the data integrity check indicate that one or more data state metrics fail to satisfy respective quality criteria (e.g., the RBER exceeds a predefined threshold, the bit error count per page exceeds a predefined threshold, and/or the valley width of a particular threshold level exceeds a predefined threshold), one or more media management operations can be performed on the affected blocks in order to mitigate the detected memory degradation. In an illustrative example, the media management operations can include refreshing, or "folding," operations, which involve reading all the data of an affected or "bad" memory block, copying or relocating the data stored at the affected memory block of the memory device to another memory block (e.g., a healthy or "good" memory block), and erasing the affected memory block.

In certain memory sub-systems, the scan operations are performed based on a predetermined, static time interval. Additionally, the predefined thresholds for the data state metrics that dictate whether media management operations are to be performed are also static. In some memory sub-systems, both the predetermined time interval and the predefined thresholds are based on end-of-life specifications of the memory device. That is, memory sub-systems define the static scan frequency time interval and the static predefined data state metric thresholds based on specifications reported at the end-of-life of a memory device. For example, memory sub-systems can perform memory characterizations that determine an error rate at or near the end-of-life of a memory device, and based on that error rate can determine the static scan frequency and static predefined data state metric thresholds to use throughout the entire life of the memory device.

However, because memory degradation is dependent on the number of PECs, using the scan frequency based on the end-of-life specifications of a memory device can result in performing scans too frequently when the memory device has a low PEC count (e.g., near the beginning of life of the memory device). Additionally, using the data state metric thresholds based on the end-of-life specifications can result in performing media management operations too frequently and/or unnecessarily when the memory device has a low PEC count (e.g., near the beginning of life of the memory device). Applying a static scan frequency throughout the lifetime of the memory device can result in unnecessarily over-scanning the memory device, while maintaining the data state metric threshold values throughout the lifetime of the memory device can result in over-folding. Either over-scanning or over-folding can result in reduced performance of the memory device, and can affect the quality of service (QoS) of the memory device.

Some memory sub-systems include wafers that can have a large number of memory devices (e.g., approximately 148 memory devices or memory dies) with varying end-of-life data retention capabilities. These systems an employ a memory device (e.g., a memory die) "binning" approach to categorize each of the multiple memory devices into one of a number of bins (e.g., three bins) which are each associated with adjusted system parameters. For example, some approaches categorize memory devices having a lower capability to a first bin and categorize other memory devices having a higher capability to a third bin. The system then applies a higher scan frequency for the memory devices categorized in the first bin and a lower scan frequency for the memory devices categorized in the third bin. According to the memory device binning approach, the memory devices are characterized using probes at a beginning-of-life (BOL) stage and a model (e.g., an artificial intelligence model) is employed to categorize the memory devices based on the BOL characterization. Furthermore, the models used in the BOL characterization-based binning approaches generate a read window budget (RWB) loss prediction based on a sum of all read margins or valley widths, where each read margin represents an amount of voltage margin between adjacent memory cell distributions.

However, some models employed to predict the capabilities of the memory device at an end-of-life (EOL) stage based on a BOL characterization can be inaccurate. The predictions generated by these models based on BOL characterizations (also referred to as "factory adaptive" binning) are inaccurate due to deviations in memory device capability caused by variations in the actual workload experienced by the respective memory devices. The factory adaptive approaches fail to adequately monitor and adjust binning over the life of the memory devices in view of the actual workloads and performance properties of the memory devices. Furthermore, the use of models to establish bin assignments for memory devices based on a RWB loss predictions (also referred to as ESUM-based predictions) results in inaccurate binning predictions due to variation in read margin (e.g., read margin m1) corresponding to the erase distribution (L0) and a first program level distribution (L1).

Aspects of the present disclosure address the above and other deficiencies by having a memory sub-system that adaptively adjusts the scan frequency of media (e.g., memory devices or memory dies) based on data retention (DR) capability predictions generated by a trained machine-learning model (herein referred to as a "prediction model"). In an embodiment, a scan management component or system executes an adaptive media scan process during a middle-of-life (MOL) stage of a memory device (e.g., after a threshold number of PEC of the memory device). In the adaptive media scan process, a program operation is executed with respect to a set of memory devices of the memory sub-system to generate a set of program distributions (e.g., L1 to L7). The adaptive media scan process measures a set of read margin values corresponding to the program distributions of the set of memory devices. The set of measured read margin values includes odd-numbered read margins (m) corresponding to the program distributions (e.g., L1 to L7 of a TLC memory device) of the memory device.

The adaptive media scan process applies the prediction model to the measured set of margins to generate a set of margin predictions, where each margin prediction is based on a wordline group (WLG) (i.e., a set of adjacent wordlines) and page type (also referred to as "wordline group and page type-based margin prediction" or "margin prediction"). Accordingly, each margin prediction represents a prediction of the margin based on an associated page type (e.g., LP, UP, or XP) and wordline group (e.g., WLG 1, WLG 2, ... WLG n). Advantageously, the margin predictions are generated as a function of both the page type and wordline group, and, accordingly, the margin predictions have a lower noise level and yield more accurate bin assignments and scan frequencies for the respective memory dies, thereby reducing the corresponding yield loss.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., one or more memory device(s) 130), or a combination of such. According to embodiments, the media includes a set of memory devices 130 (e.g., a set of memory dies).

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIIVIM), a small outline DIIVIM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., the one or more memory device(s) 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include not-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory device(s) 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device(s) 130. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some embodiments, the memory device(s) 130 include local media controllers 135 that operate in conjunction with memory sub-system controller 115 to execute operations on one or more memory cells of the memory device(s) 130. An external controller (e.g., memory sub-system controller 115)

can externally manage the memory device 130 (e.g., perform media management operations on the memory device(s) 130). In some embodiments, a memory device 130 is a managed memory device, which is a raw memory device (e.g., memory array 104) having control logic (e.g., local controller 135) for media management within the same memory device package. An example of a managed memory device is a managed NAND (MNAND) device. Memory device(s) 130, for example, can each represent a single die having some control logic (e.g., local media controller 135) embodied thereon. In some embodiments, one or more components of memory sub-system 110 can be omitted.

In one embodiment, the memory sub-system 110 includes a scan management component 113 that can manage assignment of a set of memory devices 130 into respective bins based on a read margin prediction generated as a function of a wordline group and page type associated with a respective memory device by a supervised machine-learning model (i.e., the "prediction model"). The scan management component 113 uses the prediction model to generate the end-of-life (EOL) stage data retention (DR) capability prediction (i.e., the read margin prediction or "margin prediction") based on margin data corresponding to the set of memory devices 130 that is measured and collected during a middle-of-life stage of the memory devices 130.

The scan management component 113 uses the prediction model to generate read margin predictions as function of page type and wordline group. The scan management component 113 uses the EOL margin predictions (i.e., the page type and wordline group-based margin prediction) to categorize or assign each memory device of the set of memory devices to a respective bin of a set of bins (e.g., bin 1, bin 2, and bin 3) that are each associated with adjusted system parameters. Each bin is associated with binning criteria (one or more threshold margin levels) based on the predicted capability level (e.g., the margin prediction). For example, a first subset of memory devices having a margin prediction between a first threshold margin level (threshold 1) and a second threshold margin level (threshold 2) are assigned by the scan management component 113 to bin 1, a second subset of memory devices having a margin prediction between threshold 2 and a third threshold margin level (threshold 3) are assigned by the scan management component 113 to bin 2, and a third subset of memory devices having a margin prediction greater than threshold 3 are assigned by the scan management component 113. In an embodiment, the threshold margin levels are extracted from test data based on a normal distribution model of the dataset. For example, the first threshold margin level can represent a center of a normal distribution minus 2-sigma, the second threshold margin level can represent the center of the normal distribution minus 1-sigma, and so on.

Each bin is associated with an adjusted or different scan frequency, such that memory devices assigned to bin 1 have a first scan frequency, memory devices assigned to bin 2 have a second scan frequency, and memory devices assigned to bin 3 have a third scan frequency, where the first scan frequency is greater than the second scan frequency and the second scan frequency is greater than the third scan frequency. Advantageously, the memory devices with the lowest predicted EOL capability based on the margin prediction are assigned to bin 1 and scanned at the highest frequency as compared to the memory devices in bins 2 and 3. Furthermore, memory devices with the highest predicted EOL capability based on the margin prediction are assigned to bin 3 and scanned at a lowest frequency as compared to the memory devices in bins 1 and 2.

In an embodiment, one or more portions of the scan management component 113 of the memory sub-system controller can advantageously execute an adaptive scan process including the application of the supervised learning model to generate page type and wordline group-dependent margin predictions based on a set of measured margins collected during an MOL stage of the memory devices. The adaptive scan process further includes assigning the memory devices to respective bins based on the margin predictions (i.e., by page type and wordline group), where each bin is associated with an applicable scan frequency and folding threshold. Further details with regards to the operations of scan management component 113 are described below.

Figure 1B:
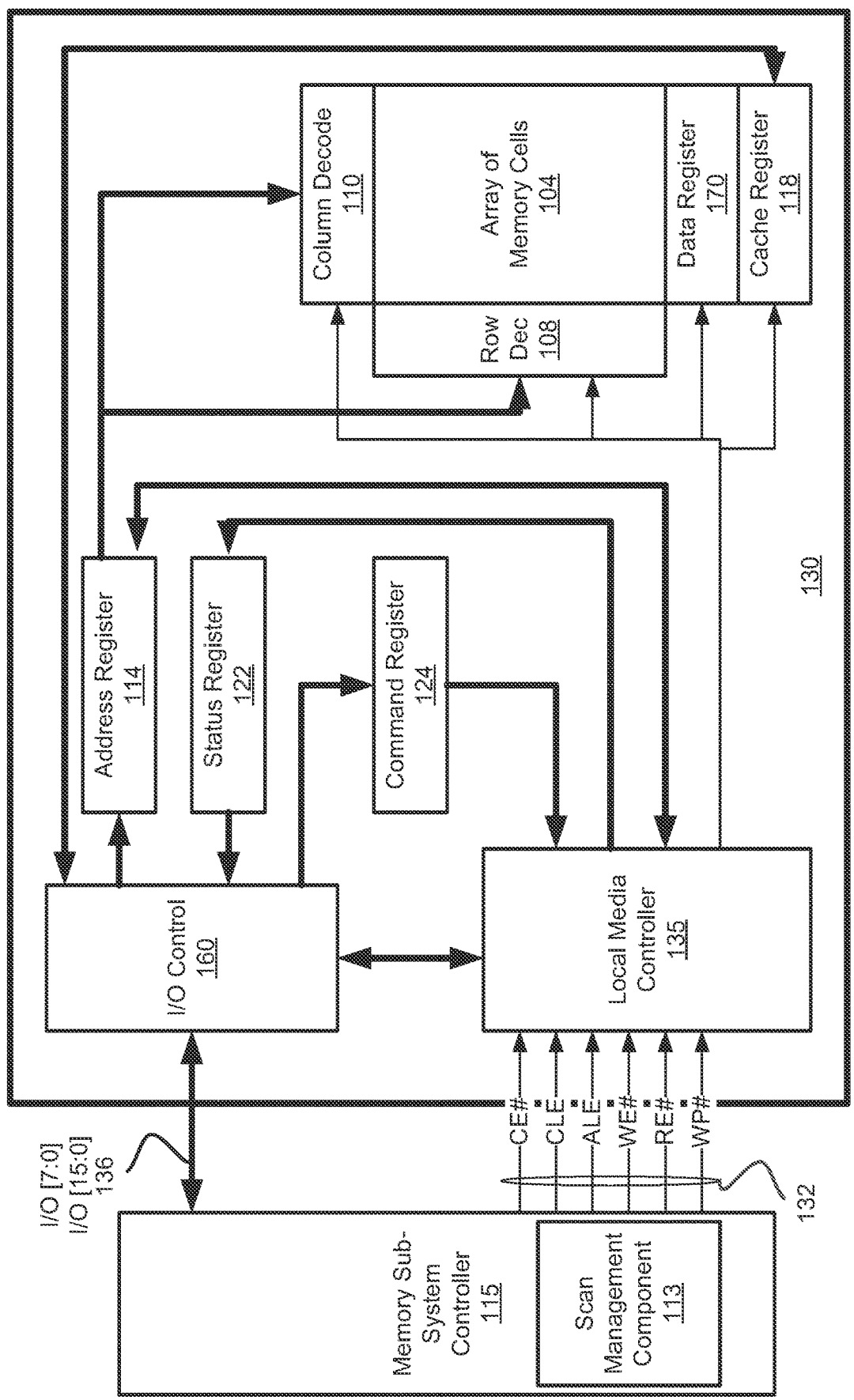
FIG. 1B is a block diagram of memory device(s) in communication with a memory sub-system controller of a memory sub-system, in accordance with one or more embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device(s) 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 110 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device(s) 130. An address register 114 is in communication with I/O control circuitry 160 and row decode circuitry 108 and column decode circuitry 110 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 110 to control the row decode circuitry 108 and column decode circuitry 110 in response to the addresses. In one embodiment, the memory sub-system controller 115 and the local media controller 135 include portions of the scan management component 113 which are configured to enable communication between the memory sub-system controller 115 and the local media controller 135 to perform the steps and operations associated with the management of the wordline leakage testing of one or more of memory device(s) 130, in accordance with embodiments of the present application.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 204, e.g., by sensing a state of a data line connected to that memory cell. A status register 122 may be in communication with I/O control circuitry 160 and the local memory controller 135 to latch the status information for output to the memory sub-system controller 115.

Memory device(s) 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command register 124. The addresses may be received over input/output (I/O) pins [7:0] of I/O bus 136 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 118. The data may be subsequently written into data register 170 for programming the array of memory cells 104.

In an embodiment, cache register 118 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

FIG. 2 is a flow diagram of an example method of establishing a supervised learning model that is trained and validated by test data to generate page type and wordline group-based margin predictions for a set of memory devices of a memory sub-system, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by scan management component 113 of FIGS. 1A and 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, processing logic identifies a dataset corresponding to a set of memory devices (e.g., memory dies). The initial dataset can include information relating to the memory blocks of the set of memory dies and can be based on endurance and data retention testing of the memory devices. In an embodiment, the dataset can include high temperature data retention testing which determines a total read margin (e.g., ESUM) voltage (e.g., in millivolts) as a function of a time after program (TAP) of the memory devices. For example, the initial dataset can include data associated with a wafer including 16 memory devices (e.g., 16 memory dies). At operation 220, optionally, one or more preprocessing steps or operations can be performed on the initial dataset. For example, the preprocessing steps can include format generalization, noise reduction, etc.

At operation 230, the initial dataset is split into initial subsets. A first initial subset can include the data associated with X % of the memory devices and designated for training. A second initial subset can include data associated with 100-X % of the memory devices and designated for testing. For example, the first initial subset (e.g., the training dataset) can include data associated with the 75% of the memory devices (e.g., 12 memory devices of the total of 16 memory devices) and the second initial subset (e.g., the testing dataset) can include data associated with the remaining 25% (e.g., 100-75%) of the memory devices (e.g., 4 memory devices of the total of 16 memory devices). In an embodiment, the memory devices can be randomly split for the purposes of establishing the training dataset and the testing dataset.

At operation 240, the training dataset is trained using a machine learning algorithm configured to determine a read margin level corresponding to the program distributions associated with the memory devices associated with the first training set. In an embodiment, the machine learning algorithm can employ linear regression modeling or other suitable modeling approach to determine a read margin corresponding to programming distributions, as shown in FIG. 3.

Figure 3:
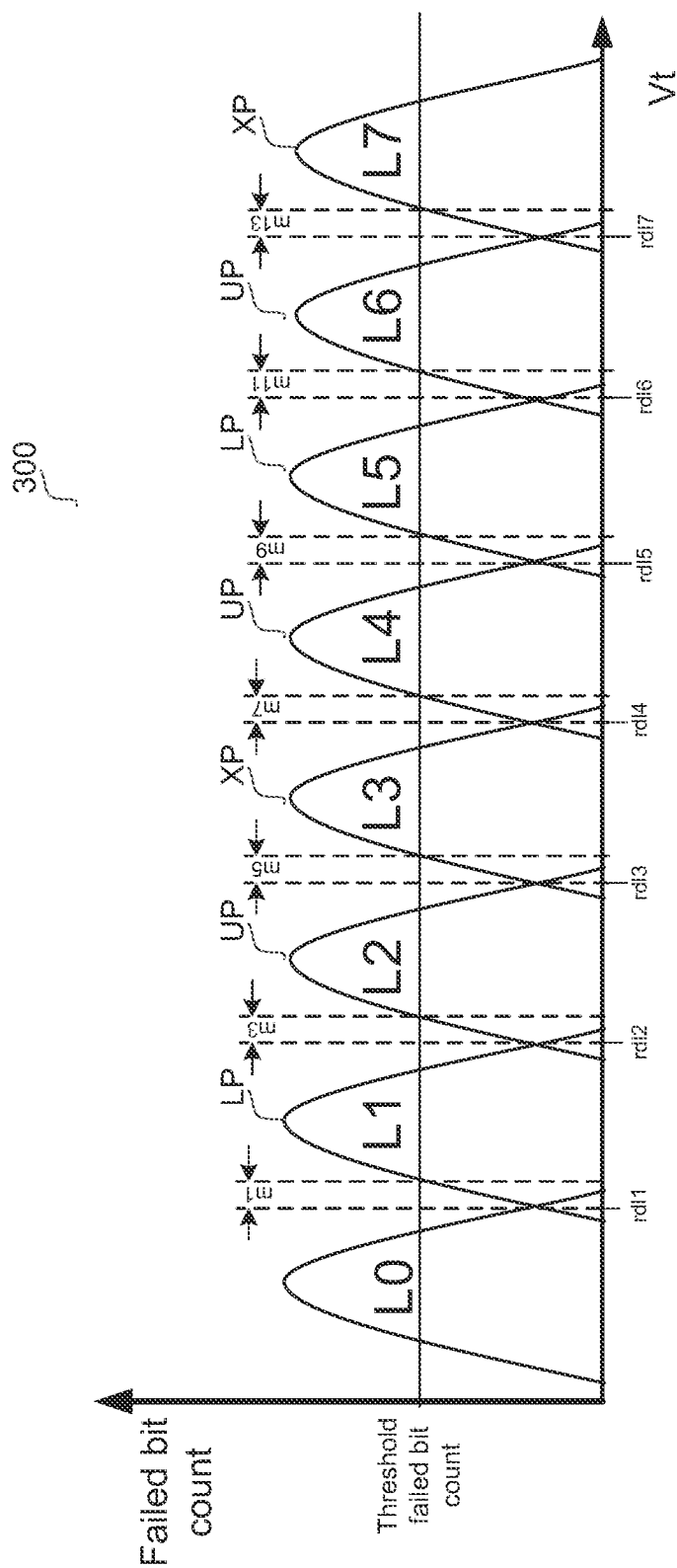
FIG. 3 illustrates an example distributions corresponding to a set of program levels and associated read margin levels used by a supervised learning model, in accordance with one or more embodiments of the present disclosure.

FIG. 3 illustrates an example graph of a set of distributions 300 corresponding to a set of program levels (e.g., L1 to L7) and an erase level (L0) (e.g., as a function of failed bit counts and threshold voltage) and a set of read margin levels that is used by the supervised learning model to generate the trained dataset corresponding to the X % of memory devices, according to one or more embodiments. As shown in FIG. 3, program levels L1 and L5 correspond to the lower page type (LP), program levels L2, L4, and L6 correspond to the upper page type (UP), and program levels L3 and L7 correspond to the extra page type (XP). Each distribution level is associated with a corresponding read voltage level (rdl) (e.g., L1 is associated with rdl1, L2 is associated with rdl2, ..., and L7 is associated with rdl7.

In an embodiment, the trained dataset is based on the data corresponding to the odd-numbered margins associated with the respective read levels (e.g., m1, m3, m5, m7, m9, m11, and m13). In an embodiment, the trained dataset for the lower pages is based on read margins m1 and m9, the trained dataset for the upper pages is based on read margins m3, m7, and m11, and the trained dataset for prediction associated with the extra pages is based on read margins m5 and m13.

As shown in FIG. 3, the respective odd-numbered read margins (m1, m3, ... m13) represent a threshold voltage width between a respective read level voltage (rdl) and a threshold voltage at which the corresponding distribution reaches a threshold error count level (e.g., a point on a lower tail of the distribution at which the corresponding error count reaches the threshold error count level).

With reference to FIG. 2, at operation 250, the trained dataset is split by wordline group (WLG) into a set of trained sub-datasets of data. As shown in FIG. 2, the trained dataset is split into a first sub-dataset corresponding to wordline group 0 (WLG=0), a second sub-dataset corresponding to wordline group 1 (WLG 1), ... and an Nth sub-dataset corresponding to wordline group N (WLG N). As shown in FIG. 2, the training phase results in a trained machine learning model corresponding to the read margin levels based on page type and wordline group. For example, the modeling is performed on each combination of page type and wordline group. In an embodiment, the set of trained models components (or sub-models) can include a first trained sub-model generated for wordline group 0 and the LP page type (e.g., a first page type), wordline group 1 and the LP page type, ..., wordline group N and the LP page type, wordline group 0 and the UP page type (e.g., a second page type), wordline group 1 and the UP page type, ..., wordline group N and the UP page type, wordline group 0 and the XP page type (e.g., a third page type), wordline group 2 and the XP page type, ..., and wordline group N and the XP page type.

For example, for each wordline group, a trained model processed via the testing phase includes a trained sub-model for each page type and wordline group combination. For example, for a memory device with 16 wordline groups (e.g., N=15), and three page types (LP, UP, and XP), a total of 48 sub-models are trained. At operation 260, the trained sub-models (e.g., the set of page type and wordline group-based sub-models) are consolidated to generate a consolidated model (e.g., the supervised learning margin prediction model or "prediction model") that is used by the scan management component to generate prediction during a middle-of-life stage of the memory devices, as described in detail below. In an example, the prediction model (e.g., the consolidated model) is configured to generate a set of margin predictions (e.g., a total of 48 predictions) on a per page type and wordline group-bases (e.g., a margin prediction for each of the 16 wordline groups for each of the 3 page types).

At operation 270, the second initial subset of data (e.g., the data associated with 100-X % of the memory devices identified during the split in operation 230) is tested to generate a test dataset. At operation 280, the data associated with the prediction model generated via the training process is compared to the test dataset to validate the prediction model. According to embodiments, the prediction model can be based on any suitable machine learning model (e.g., classification models (e.g., linear classifiers, support vector machines, decision trees, k-nearest neighbor, random forest, etc.), regression models (linear regression, logistical regression, polynomial regression, etc.), etc.

According to an embodiment, a linear regression algorithm is used. The linear regression algorithm-based prediction model can be setup to generate a read margin prediction (y) by page type (LP, UP, and_XP) and wordline group (WLG0 through WLGN) in accordance with the following expression:

$$y = c_0 + \ldots + c_p x_p;$$

where $c_i$ is a list of coefficients and $x_i$ is a list of features.

In an embodiment, the list of features can include a PEC value, a time after program (TAP) value, and one or more corresponding margin values of the set of odd-numbered margin values. For example, the margin prediction (y) for XPwlg can be based on a PEC value, TAP value, m5, and m13; the margin prediction for UPwlg can be based on a PEC value, TAP value, m3, m7, and m11; and the margin prediction for LPwlg can be based on a PEC value, TAP value, m1 and m9.

Figure 4:
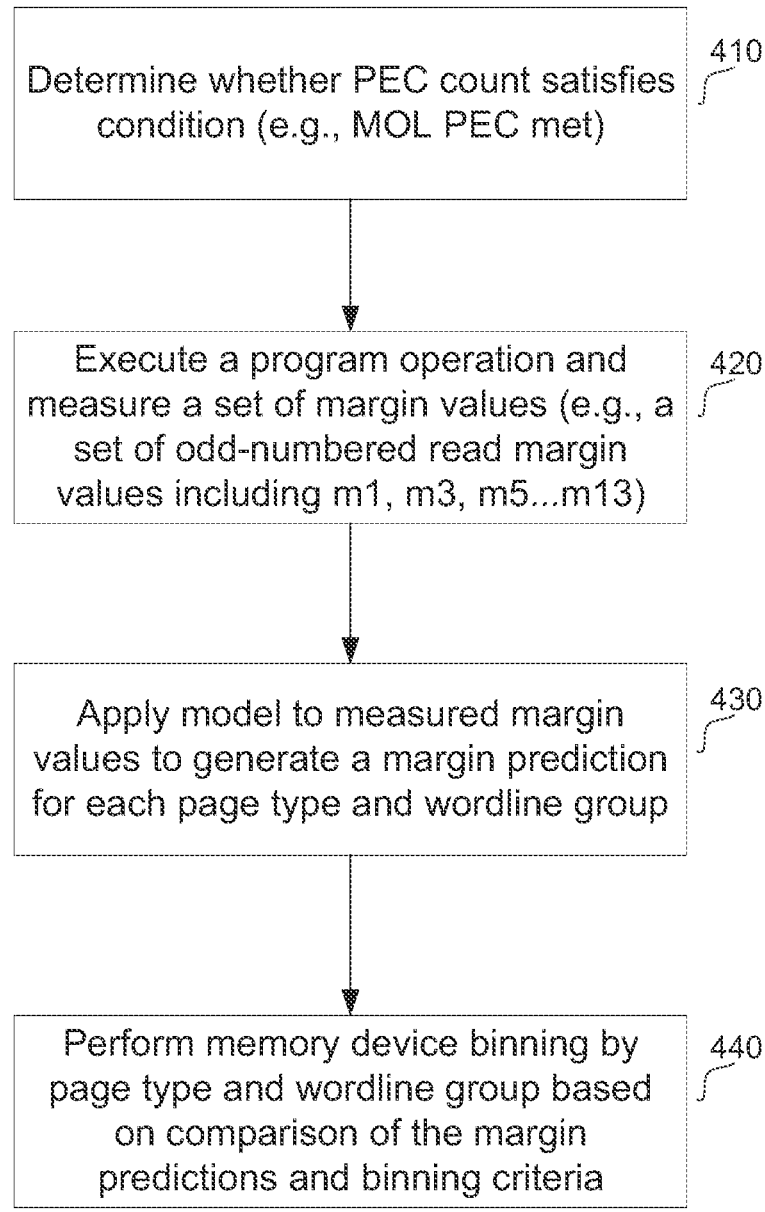
FIG. 4 is a flow diagram of an example adaptive media scan process to categorize a set of memory devices into respective bins associated with different scan frequencies, where the categorization is based on end-of-life (EOL) margin predictions generated by a prediction model based on read margin measurements collected during a middle-of-life (MOL) stage of a set of memory devices of a memory sub-system, according to one or more embodiments of the present disclosure.

FIG. 4 is a flow diagram of an example adaptive media scan process to categorize a set of memory devices into respective bins associated with different scan frequencies, where the categorization is based on end-of-life (EOL) margin predictions generated by a prediction model (e.g., the prediction model established in accordance with the operations of FIG. 2) based on read margin measurements collected during a middle-of-life (MOL) stage of a set of memory devices of a memory sub-system, in accordance with one or more embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by scan management component 113 of FIGS. 1A and 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, processing logic (e.g., scan management component 113 of FIGS. 1A and 1B) initiates an adaptive media scan process and determines whether a PEC count satisfies a condition. In an embodiment, the PEC count check is performed to determine the one or more memory devices are at a MOL stage. For example, the condition is satisfied if the PEC count reaches a PEC threshold level. The PEC threshold level can be associated with a MOL stage (e.g., 1.5K PECs). In an embodiment, if the PEC count satisfies the condition, the processing logic proceeds to operation 420.

In operation 420, the processing logic executes a program operation and measures a set of margin values corresponding to program distributions associated with the set of memory devices. In an embodiment, the set of measured margin values includes the odd-numbered margin values (e.g., m1, m3, m5 . . . m13), as shown in FIG. 3. In operation 430, the prediction model (as established in accordance with the operations of FIG. 2) is applied to the margin value measurements (e.g., the set of odd-numbered margin values) to generate a set of margin predictions. Advantageously, the set of margin predictions includes a margin prediction for each combination of page type and wordline group. In an embodiment, the page type and wordline group-based margin predictions provide an indicator of data retention capability of the respective memory devices at an EOL stage.

In an embodiment, the set of margin predictions can include a first prediction generated for wordline group 1 and the LP page type, wordline group 2 and the LP page type, . . . , wordline group N and the LP page type, wordline group 1 and the UP page type, wordline group 2 and the UP page type, . . . , wordline group N and the UP page type, wordline group 1 and the XP page type, wordline group 2 and the XP page type, . . . , and wordline group N and the XP page type. In an embodiment, the wordline group and page type prediction is based on a corresponding margin associated with the particular page type. In an embodiment, the lower pages correspond to L1 and L5, the upper pages correspond to L2, L4, and L6, and the extra pages correspond to L3 and L7. In an embodiment, the prediction for the lower pages is based on the odd-numbered margins associated with the respective read levels (e.g., m1, m3, m5, m7, m9, m11, and m13). In an embodiment, the margin prediction associated with the lower pages is based on read margins m1 and m9, the prediction associated with the upper pages is based on read margins m3, m7, and m11, and the prediction associated with the extra pages is based on read margins m5 and m13.

At operation 440, the processing logic performs memory device binning by page type and wordline group based on a comparison of the margin predictions and binning criteria associated with a set of bins (e.g., bin 1, bin 2, and bin 3). As illustrated in FIG. 5, the processing logic can maintain a data structure 500 including the binning criteria for each page type. As shown in FIG. 5, the data structure includes binning criteria for the XP page type can include a first binning threshold (BT1_XP), a second binning threshold (BT2_XP), and a third binning threshold (BT3_XP). In an embodiment, the binning criteria for the UP page type can include a first binning threshold (BT1_UP), a second binning threshold (BT2_UP), and a third binning threshold (BT3_UP). In an embodiment, the binning criteria for the LP page type can include a first binning threshold (BT1_LP), a second binning threshold (BT2_LP), and a third binning threshold (BT3_LP).

At operation 440, each margin prediction of the set of page type and wordline-based margin predictions is compared to the binning criteria for the corresponding page type to determine the bin assignment. For example, for the XP page type, a first memory device having a margin prediction between BT1_XP and BT2_XP is assigned to bin 1, a second memory device having a margin prediction between BT2_XP and BT3_XP is assigned to bin 2, and a third memory device having a margin prediction that is greater than BT3_XP is assigned to bin 3. The comparison of the margin prediction to the binning criteria associated with the corresponding page type is performed for each memory device to categorize each memory device in an appropriate bin. In an embodiment, each bin (e.g., bin 1, bin 2, and bin 3) is associated with a respective scan frequency and folding threshold. In an embodiment, bin 1 is associated with a first scan frequency, bin 2 is associated with a second scan frequency and bin 3 is associated with a third scan frequency, where the first scan frequency is higher than the second scan frequency, and where the second scan frequency is higher than the third scan frequency. the memory devices For example, a memory device having an UP page type that is assigned to bin 2

Figure 6:
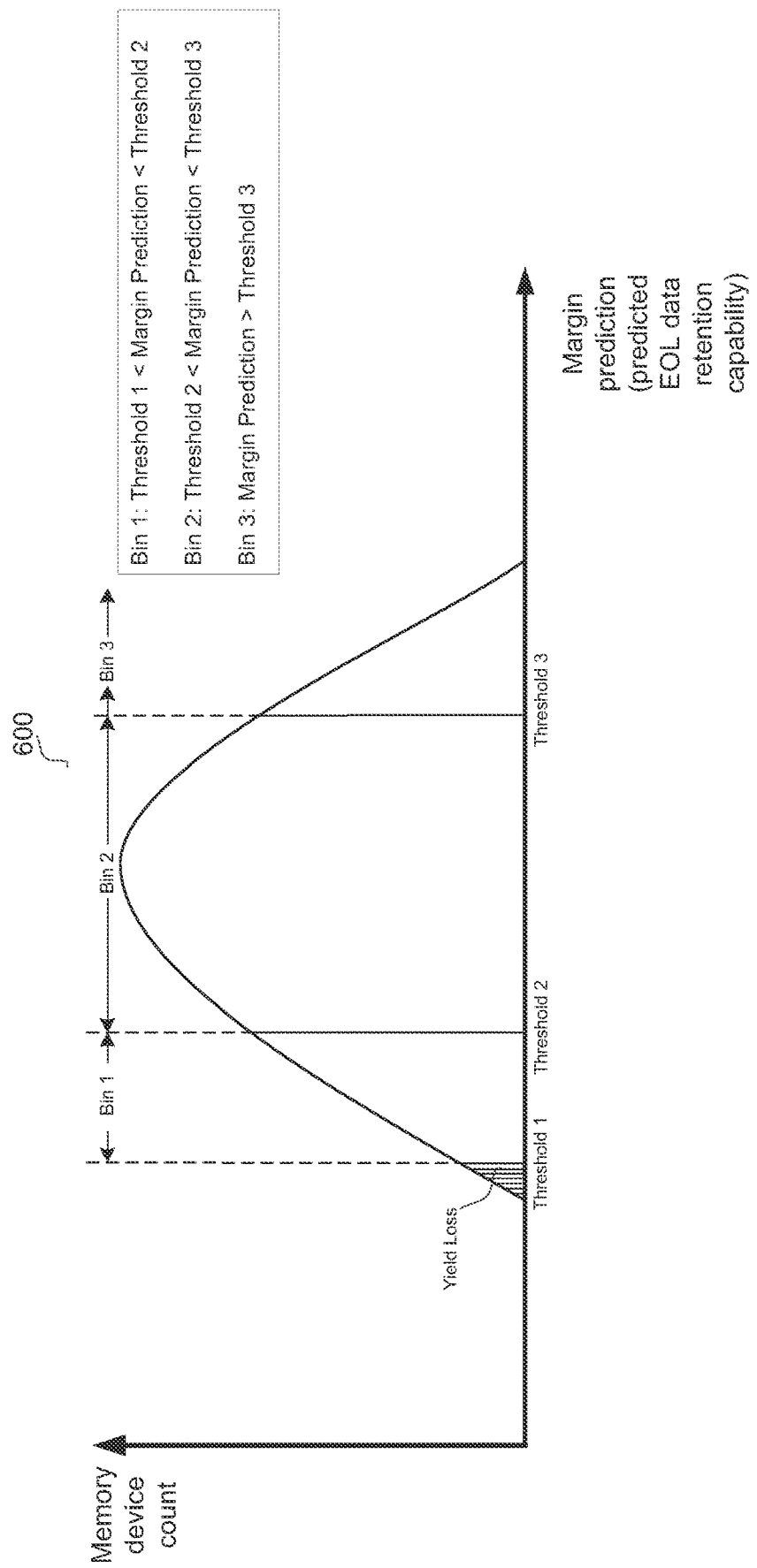
FIG. 6 illustrates an example distribution of memory devices categorized in respective bins based on a comparison of page type and wordline group-based margin predictions and binning criteria, according to one or more embodiments of the present disclosure.

FIG. 6 illustrates an example distribution 600 of memory devices categorized in respective bins based on the page type and wordline group-based margin prediction (e.g. the EOL data retention capability metric). As shown, the distribution represents a first subset of memory devices having a margin prediction between a first threshold (threshold 1) and second threshold (threshold 2) categorized in bin 1, a second subset of memory devices having a margin prediction between threshold 2 and a third threshold (threshold 3) categorized in bin 2, and a third subset of memory devices having a margin prediction greater than threshold 3 categorized in bin 3. In an embodiment, memory devices assigned to bin 1 have a lowest relative predicted data retention capability (as a function of the predicted margin) at an EOL stage and memory devices assigned to bin 3 have a highest relative predicted data retention capability at an EOL stage. In an embodiment, bin 1 is associated with a higher relative scan frequency than scan frequencies associated with bins 2 and 3, as a function of the relative predicted data retention capabilities.

Figure 7:
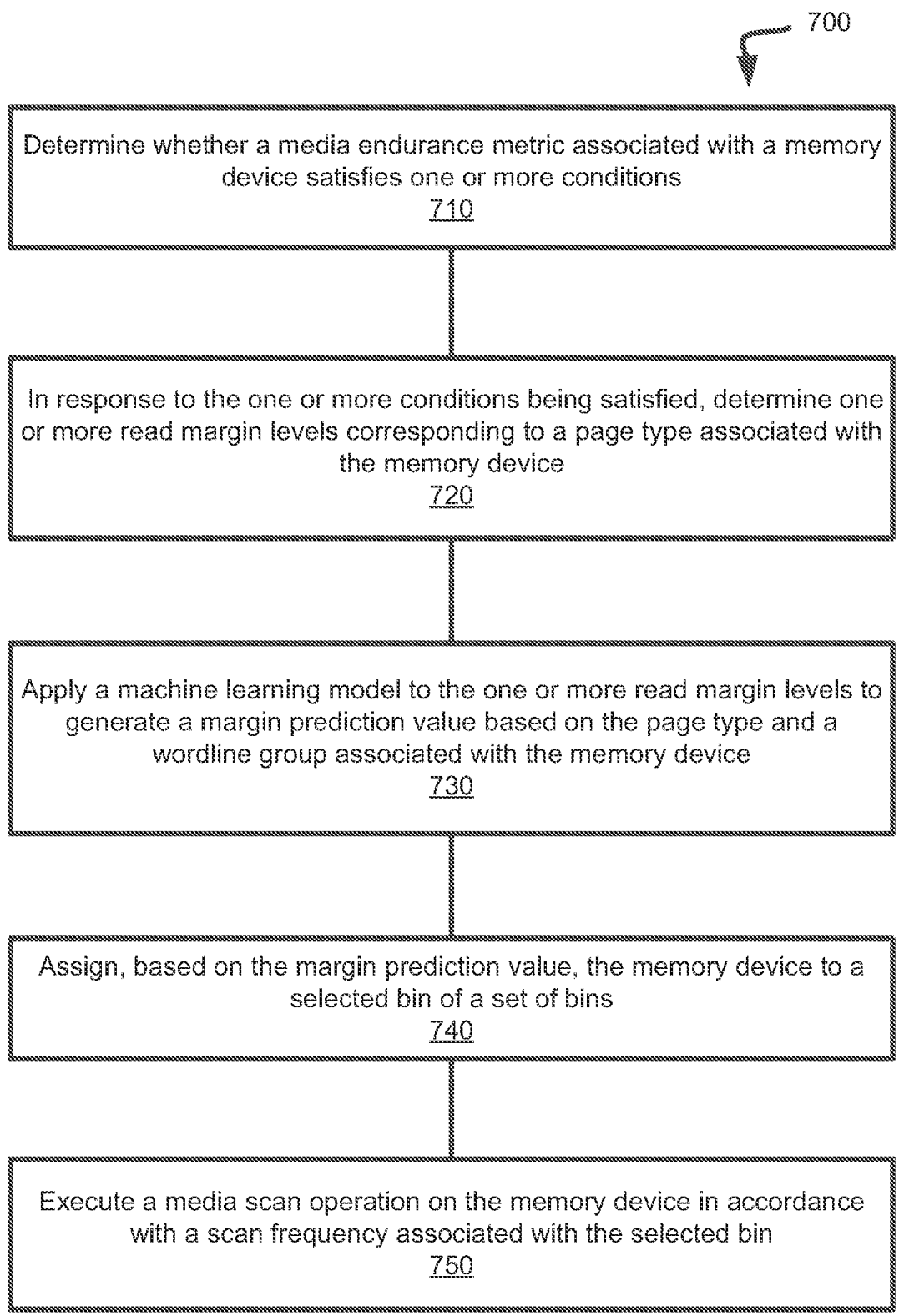
FIG. 7 is a flow diagram of an example adaptive media scan process to assign a memory device of a set of memory devices to a bin associated with a corresponding media scan frequency, according to one or more embodiments of the present disclosure.

FIG. 7 is a flow diagram of an example adaptive media scan process to assign a memory device of a set of memory devices to a bin associated with a corresponding media scan frequency, according to one or more embodiments. According to embodiments, the adaptive media scan process assigns or categorizes the memory device based on an end-of-life (EOL) margin prediction generated by a prediction model, where the margin prediction is based on read margin measurements collected during a middle-of-life (MOL) stage of a set of memory devices of a memory sub-system, in accordance with one or more embodiments of the present disclosure. In an embodiment, the margin prediction for the memory device is based on a combination of the page type and wordline group. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by scan management component 113 of FIGS. 1A and 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, processing logic (e.g., scan management component 113 of FIGS. 1A and 1B) determines whether a media endurance metric associated with a memory block of the memory device satisfies one or more conditions. In an embodiment, the media endurance metric is a PEC count associated with the memory device. In an embodiment, the one or more conditions includes a first condition associated with a first PEC threshold count associated with a MOL stage of a memory device (e.g., the first PEC threshold count is 1K, 1.5K, 2K, etc.). In an embodiment, the first condition is satisfied if the PEC count is greater than or equal to the first PEC threshold count. In an embodiment, the one or more conditions can include a second condition associated with a second PEC threshold count (e.g., a PEC count equal to the first PEC threshold count plus a PEC count interval (e.g., 500, 1K, 1.5K, etc.). According to embodiments, the processing device can iteratively perform method 700 each time the PEC count reaches a corresponding threshold count. For example, the method 700 can be performed in response to the memory device reaching a MOL stage (e.g., reaching the first PEC threshold count, such as 1.5K) and iteratively performed one or more additional times during the MOL stage (e.g., every threshold PEC count interval, such every 500 PECs within the MOL stage).

At operation 720, in response to the one or more conditions being satisfied, the processing logic determines one or more read margin levels corresponding to a page type associated with the memory device. In an embodiment, one or more read margin levels can include a set of odd-numbered read margin levels corresponding to the page type associated with the memory device. For example, if the memory device is associated with a LP page type, the one or more read margin levels include read margins m1 and m9 (e.g., as shown in FIG. 3). In another example, if the memory device is associated with a UP page type, the one or more read margin levels include read margins m3, m7, and m11. In another example, if the memory device is associated with an XP page type, the one or more read margin levels include read margins m5 and m13.

In operation 730, the processing logic applies a machine learning model to the one or more read margin levels to generate a margin prediction value based on the page type and a wordline group associated with the memory device. In an embodiment, the machine learning model (i.e., the prediction model described in detail above) is trained to receive the one or more measured read margin levels and generate the margin prediction value (e.g., a page type and wordline group-based margin prediction).

In operation 740, the processing logic assigns, based on the margin prediction value, the memory device to a selected bin of a set of bins. In an embodiment, each bin of the set of bins is associated with binning criteria (e.g., one or more margin thresholds). In an embodiment, the model-generated margin prediction value is compared to the binning criteria corresponding to the respective bins to determine the bin assignment. In an embodiment, each bin of the set of bins is associated with a different media scan frequency.

In operation 750, the processing logic executes a media scan operation on the memory device in accordance with a scan frequency associated with the selected bin. For example, if the selected bin is a first bin that is associated with a first scan frequency, a media scan is performed on the memory device according to the first scan frequency. In another example, if the selected bin is a second bin associated with a second scan frequency, a media scan is performed on the memory device according to the second scan frequency. In another example, if the selected bin is a third bin corresponding to the page type that is associated with a second scan frequency, a media scan is performed on the memory device according to the third scan frequency.

Advantageously, the adaptive media scan method uses the margin predictions generated based on wordline group (WLG) and page type to categorize each memory die in a selected bin of a set of multiple bins. In an embodiment, each page type (e.g., LP, UP, and XP) is associated with a set of bins (e.g., bin 1, bin 2, and bin 3), with each bin corresponding to a respective binning criteria (e.g., margin thresholds). In an embodiment, each generated wordline group and page type-based margin prediction is compared to the binning criteria associated with the corresponding page type to determine a bin assignment for the memory die. Each bin is associated with a corresponding scan frequency such that the memory dies assigned to the respective bins are scanned in accordance with the scan frequency associated with the assigned bin. Accordingly, the EOL data retention (DR) capability predictions for memory devices are generated by a supervised learning model configured based on data measured at a middle-of-life (MOL) stage (e.g., after approximately 1.5K PEC of the memory device and iteratively for every X number of PECs).

Figure 8:
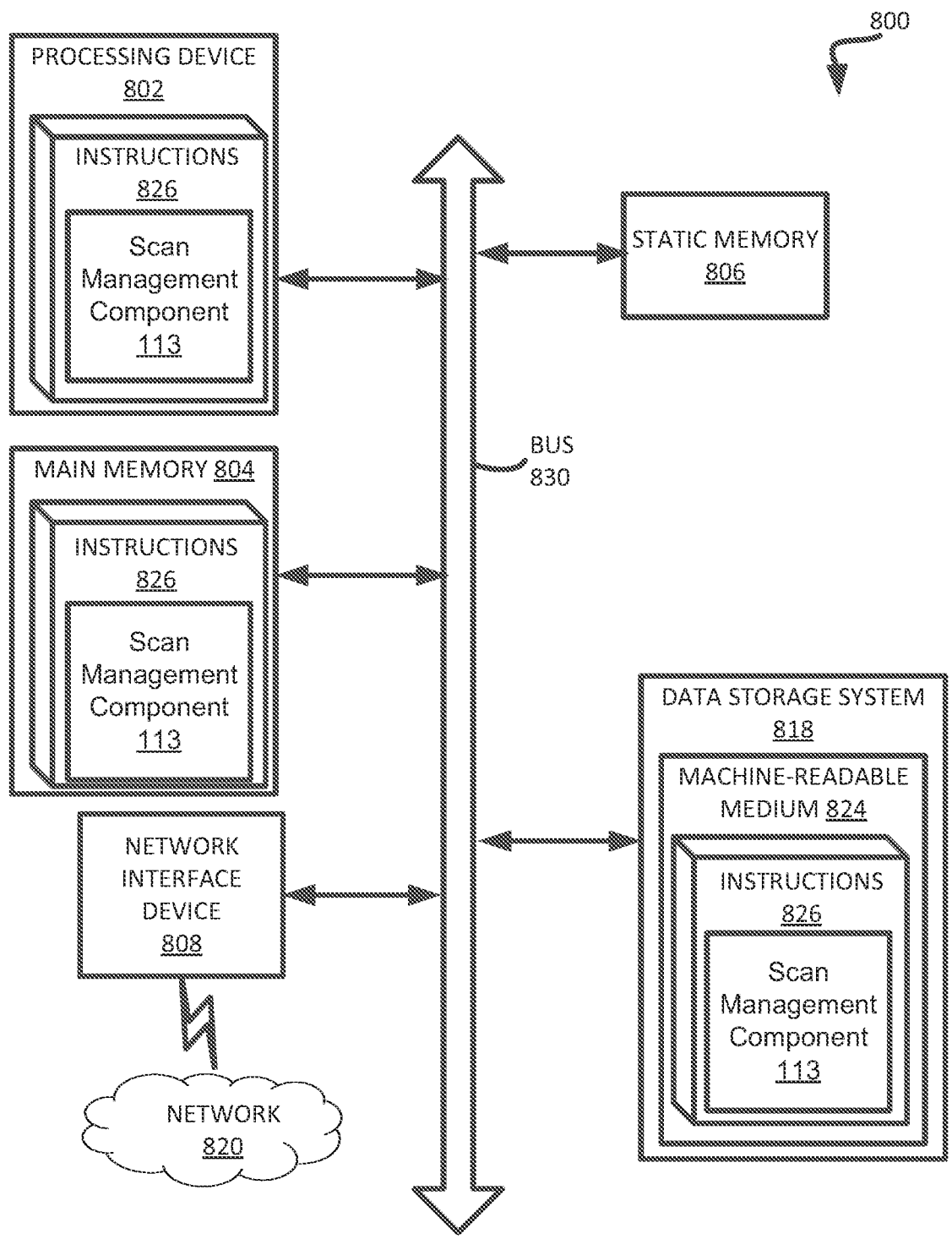
FIG. 8 is a block diagram of an example computer system in which embodiments of the present disclosure may operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1A) that includes, is coupled to, or utilizes a memory sub-system (e.g., the memory sub-system 110 of FIGS. 1A and 1B) or can be used to perform the operations of a controller (e.g., to execute an operating system to perform operations corresponding to the scan management component 113 of FIGS. 1A and 1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIGS. 1A and 1B.

In one embodiment, the instructions 826 include instructions to implement functionality corresponding to the scan management component 113 of FIGS. 1A and 1B). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled with the memory device, to perform operations comprising:
      determining whether a media endurance metric associated with the memory device satisfies one or more conditions;
      in response to the one or more conditions being satisfied, determining one or more read margin levels corresponding to a page type associated with the memory device;
      applying a machine learning model to the one or more read margin levels to generate a margin prediction value based on the page type and a wordline group associated with the memory device;
      assigning, based on the margin prediction value, the memory device to a selected bin of a set of bins; and
      executing a media scan operation on the memory device in accordance with a scan frequency associated with the selected bin.

2. The system of claim 1, wherein the media endurance metric comprises a program/erase cycle (PEC) count; and wherein the one or more conditions comprise a first condition that is satisfied when the PEC count associated with the memory device is greater than or equal to a threshold PEC level corresponding to a middle-of-life stage of the memory device.

3. The system of claim 1, wherein the set of bins comprises a first bin associated with first binning criteria comprising a first range based on a first threshold margin level and a second threshold margin level, a second bin associated with second binning criteria comprising a second range based on the second threshold margin level and third threshold margin level, and a third bin associated with third binning criteria comprising the third threshold margin level.

4. The system of claim 3, wherein the selected bin is determined as one of the first bin, the second bin, or the third bin based on a comparison of the margin prediction value and one or more of the first binning criteria, the second binning criteria, and the third binning criteria.

5. The system of claim 4, wherein the first bin is associated with a first scan frequency, the second bin is associated with a second scan frequency, and the third bin is associated with a third scan frequency, and wherein the first scan frequency is greater than the second scan frequency, and wherein the second scan frequency is greater than the third scan frequency.

6. The system of claim 1, wherein one or more read margin levels are determined at a middle-of-life stage of the memory device, and wherein the margin prediction value represents a data retention capability of the memory device at an end-of-life stage.

7. The system of claim 5, wherein the one or more read margin levels comprise a subset of odd-numbered read margin levels corresponding to one or more program distributions associated with the page type of the memory device.

8. The system of claim 1, wherein the page type is one of a first page type, a second page type, or a third page type, and wherein the one or more read margin levels comprise one of a first subset of odd-numbered read margin levels corresponding to the first page type, a second subset of odd-numbered read margin levels corresponding to the second page type, or a third subset of odd-numbered read margin levels corresponding to the third page type.

9. A method comprising:
   determining whether a media endurance metric associated with a memory device satisfies one or more conditions;
   in response to the one or more conditions being satisfied, determining one or more read margin levels corresponding to a page type associated with the memory device;
   applying a machine learning model to the one or more read margin levels to generate a margin prediction value based on the page type and a wordline group associated with the memory device;
   assigning, based on the margin prediction value, the memory device to a selected bin of a set of bins; and
   executing a media scan operation on the memory device in accordance with a scan frequency associated with the selected bin.

10. The method of claim 9, wherein the media endurance metric comprises a program/erase cycle (PEC) count; and wherein the one or more conditions comprise a first condition that is satisfied when the PEC count associated with the memory device is greater than or equal to a threshold PEC level corresponding to a middle-of-life stage of the memory device.

11. The method of claim 9, wherein the set of bins comprises a first bin associated with first binning criteria comprising a first range based on a first threshold margin level and a second threshold margin level, a second bin associated with second binning criteria comprising a second range based on the second threshold margin level and third threshold margin level, and a third bin associated with third binning criteria comprising the third threshold margin level.

12. The method of claim 11, wherein the selected bin is determined as one of the first bin, the second bin, or the third bin based on a comparison of the margin prediction value and one or more of the first binning criteria, the second binning criteria, and the third binning criteria.

13. The method of claim 12, wherein the first bin is associated with a first scan frequency, the second bin is associated with a second scan frequency, and the third bin is associated with a third scan frequency, and wherein the first scan frequency is greater than the second scan frequency, and wherein the second scan frequency is greater than the third scan frequency.

14. The method of claim 9, wherein one or more read margin levels are determined at a middle-of-life stage of the memory device, and wherein the margin prediction value represents a data retention capability of the memory device at an end-of-life stage.

15. The method of claim 14, wherein the one or more read margin levels comprise a subset of odd-numbered read margin levels corresponding to one or more program distributions associated with the page type of the memory device.

16. The method of claim 9, wherein the page type is one of a first page type, a second page type, or a third page type, and wherein the one or more read margin levels comprise one of a first subset of odd-numbered read margin levels corresponding to the first page type, a second subset of odd-numbered read margin levels corresponding to the second page type, or a third subset of odd-numbered read margin levels corresponding to the third page type.

17. A non-transitory computer-readable storage medium comprising instructions that, when executed by a processing device, cause the processing device to perform operations comprising:
   determining whether a media endurance metric associated with a memory device satisfies one or more conditions;
   in response to the one or more conditions being satisfied, determining one or more read margin levels corresponding to a page type associated with the memory device;
   applying a machine learning model to the one or more read margin levels to generate a margin prediction value based on the page type and a wordline group associated with the memory device;
   assigning, based on the margin prediction value, the memory device to a selected bin of a set of bins; and
   executing a media scan operation on the memory device in accordance with a scan frequency associated with the selected bin.

18. The non-transitory computer-readable storage medium of claim 17, wherein the media endurance metric comprises a program/erase cycle (PEC) count; and wherein the one or more conditions comprise a first condition that is satisfied when the PEC count associated with the memory device is greater than or equal to a threshold PEC level corresponding to a middle-of-life stage of the memory device.

19. The non-transitory computer-readable storage medium of claim 17, wherein the set of bins comprises a first bin associated with first binning criteria comprising a first range based on a first threshold margin level and a second threshold margin level, a second bin associated with second binning criteria comprising a second range based on the second threshold margin level and third threshold margin level, and a third bin associated with third binning criteria comprising the third threshold margin level.

20. The non-transitory computer-readable storage medium of claim 19, wherein the selected bin is determined as one of the first bin, the second bin, or the third bin based on a comparison of the margin prediction value and one or more of the first binning criteria, the second binning criteria, and the third binning criteria; and wherein the first bin is associated with a first scan frequency, the second bin is associated with a second scan frequency, and the third bin is associated with a third scan frequency, and wherein the first scan frequency is greater than the second scan frequency, and wherein the second scan frequency is greater than the third scan frequency.

* * * * *